(12) United States Patent
Liao et al.

(10) Patent No.: US 8,451,158 B2
(45) Date of Patent: May 28, 2013

(54) ANALOG TO DIGITAL CONVERTER WITH GENERALIZED BEAMFORMER

(75) Inventors: Yu Liao, Longmont, CO (US); Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 64 days.

(21) Appl. No.: 13/174,273

(22) Filed: Jun. 30, 2011

(65) Prior Publication Data

US 2013/0002462 A1  Jan. 3, 2013

(51) Int. Cl.
*H03M 1/12* (2006.01)

(52) U.S. Cl.
USPC ........... 341/155; 375/276; 342/372; 342/375; 600/437; 600/443; 600/453; 600/457; 600/459; 341/130; 341/160

(58) Field of Classification Search
USPC .............. 341/60–90, 130–160; 600/437, 443, 600/447, 453, 454, 455, 457, 459, 458; 375/276; 342/372, 375

See application file for complete search history.

(56) References Cited

U.S. PATENT DOCUMENTS

| | | |
|---|---|---|
| 4,170,766 A | 10/1979 | Pridham et al. |
| 4,893,316 A | 1/1990 | Janc et al. |
| 5,796,636 A | 8/1998 | Andrews |
| 7,012,556 B2 * | 3/2006 | Dean et al. .................... 341/155 |
| 7,106,071 B2 | 9/2006 | Pharn et al. |
| 7,145,972 B2 | 12/2006 | Kumar et al. |
| 7,338,450 B2 * | 3/2008 | Kristoffersen et al. ....... 600/447 |
| 7,532,684 B2 | 5/2009 | Tietjen |
| 7,541,950 B2 * | 6/2009 | Wegener .......................... 341/76 |
| 7,545,323 B2 * | 6/2009 | Kalian et al. ................... 342/372 |
| 7,545,324 B2 * | 6/2009 | Kalian et al. ................... 342/372 |
| 7,705,761 B2 | 4/2010 | Tietjen et al. |
| 7,796,078 B2 * | 9/2010 | Wegener ........................ 341/159 |
| 7,896,852 B2 * | 3/2011 | DiMatteo et al. ............. 604/265 |
| 7,924,410 B2 * | 4/2011 | Fischi ........................... 356/5.11 |
| 8,184,180 B2 * | 5/2012 | Beaucoup ................... 348/240.1 |
| 8,237,597 B2 | 8/2012 | Liu et al. |
| 2006/0165198 A1 | 7/2006 | Tietjen |
| 2006/0181284 A1 | 8/2006 | Fraedrich |
| 2008/0018502 A1 * | 1/2008 | Wegener .......................... 341/50 |
| 2009/0201181 A1 * | 8/2009 | Wegener .......................... 341/76 |
| 2009/0201182 A1 * | 8/2009 | Wegener .......................... 341/76 |
| 2010/0331689 A1 * | 12/2010 | Wegener ....................... 600/443 |

* cited by examiner

*Primary Examiner* — Lam T Mai

(74) *Attorney, Agent, or Firm* — Hamilton DeSanctis & Cha

(57) ABSTRACT

Various embodiments of the present invention provide systems, apparatuses and methods for performing analog to digital conversion. For example, an analog to digital converter circuit is discussed that includes an analog input, a number of analog to digital converters and a generalized beamformer. The analog to digital converters are operable to receive the analog input and to yield a number of digital streams. Each of the analog to digital converters samples the analog input with different phase offsets. The generalized beamformer is operable to weight and combine the digital streams to yield a digital output.

20 Claims, 4 Drawing Sheets

US 8,451,158 B2

ANALOG TO DIGITAL CONVERTER WITH GENERALIZED BEAMFORMER

BACKGROUND

Various embodiments of the present invention are related to systems and methods for analog to digital data conversion, and more particularly to analog to digital converters with generalized beamformers.

Electronic signals most often take one of two forms, analog signals or digital signals. Analog signals can take any value between an upper and lower limit, smoothly changing values as the voltage or current is altered. Digital signals can take only a limited set of values, with the value being a number that represents a voltage or current level. Because the numbers are discrete, only a limited set of voltage or current levels can be represented by a digital signal. The granularity or resolution depends on the range of values represented and on the precision of the numbers representing the values in the digital signal.

An analog to digital converter (ADC) is an electronic circuit that converts analog to digital, typically by sampling the analog signal at regular intervals and producing a stream of digital values representing the voltage or current levels of the sampled analog signal. The sampling rate, the rate at which the analog signal is captured and converted to a digital value, should capture samples at twice the frequency of the highest frequency component in the analog signal, referred to as the Nyquist rate, or more.

A number of techniques have been developed to effectively increase the resolution of an analog to digital converter. For example, the resolution of an analog to digital converter may be effectively increased by oversampling and decimation, in which the sampling rate is greater than or equal to twice the Nyquist rate, and multiple samples are then added and averaged in a decimator or low pass filter to interpolate between sample values. However, for some applications, the output of an oversampling and decimating analog to digital converter is susceptible to distortion during downstream processing of the digital samples.

Thus, for at least the aforementioned reason, there exists a need in the art for increasing resolution and reducing distortion in an analog to digital converter.

BRIEF SUMMARY

Various embodiments of the present invention are related to systems and methods for analog to digital data conversion, and more particularly to analog to digital converters with generalized beamformers.

Various embodiments of the present invention provide systems, apparatuses and methods for performing analog to digital conversion. For example, an analog to digital converter circuit is discussed that includes an analog input, a number of analog to digital converters and a generalized beamformer. The analog to digital converters are operable to receive the analog input and to yield a number of digital streams. Each of the analog to digital converters samples the analog input with different phase offsets. The generalized beamformer is operable to weight and combine the digital streams to yield a digital output, in some cases forming a sample vector from the digital streams and performing a vector multiplication operation on the sample vector and on a weight vector to yield the digital output. The weight vector is operable in some instances to reduce mean square error between the digital output and a signal derived from the digital output. In some instances, the weight vector is generated using a minimum mean square error algorithm based on the digital output and the signal derived from the digital output. In some instances, the generalized beamformer includes at least one vector multiplication circuit and a vector summation circuit operable to weight and combine the plurality of digital streams to yield the digital output, for example including a vector multiplication circuit for each of the digital streams.

In some instances of the aforementioned embodiments, the analog to digital converter circuit is implemented as an integrated circuit and may be incorporated in devices and systems including but not limited to storage systems, a storage device or a data transmission device.

In some instances, the analog to digital converters are clocked with different phases of a clock signal. In some cases, the analog to digital converters generate the digital streams with non-uniform separation between the different phase offsets.

In some embodiments, the analog to digital converter circuit also includes a lowpass filter operable to filter the digital streams before the generalized beamformer weights and combines them to yield the digital output.

Other embodiments of the present invention provide methods for converting an analog signal to a digital signal. The methods include converting the analog signal to multiple streams of digital samples sampled with different phase offsets, creating a sample vector containing samples from each of the streams of digital samples, providing a weight vector adapted to reduce distortion in the digital signal, and combining the sample vector and the weight vector in a vector multiplication operation to yield the digital signal. The sample vector may contain a number of contiguous samples from each of the streams of digital samples. The weight vector is generated in some instances based on the digital signal and a signal derived from the digital signal. In some cases, the signal derived from the digital stream is generated by passing the digital signal through a digital finite impulse response filter, a detector circuit and a partial response target circuit. In some embodiments, the weight vector is targeted to reduce a mean square error between the digital signal and the signal derived from the digital signal. In some embodiments, the weight vector $w_{opt}$ is generated according to an equation $w_{opt} = R_x^{-1} \cdot r_{xy}$, where $R_x = E[x^T \cdot x]$, $r_{xy} = E[x^T \cdot \hat{y}_k]$, $x$ is the sample vector, and $\hat{y}_k$ is the signal derived from the digital signal.

Yet other embodiments of the present invention provide a storage system including a storage medium, a read/write head assembly, an amplifier circuit, an analog to digital converter, a digital finite impulse response filter, a data detector circuit, and a partial response target circuit. The read/write head assembly is operable to sense a data set on the storage medium and to provide an analog signal corresponding to the data set. The amplifier circuit is operable to amplify the analog signal to yield an amplified analog signal. The analog to digital converter is operable to sample the amplified analog signal to yield a digital data stream. The digital finite impulse response filter is operable to filter the digital data stream to yield a filtered digital data stream. The data detector circuit is operable to perform a data detection process on the filtered digital data stream to yield a detected output. The partial response target circuit is operable to convolve the detected output with a target to yield the derivative of the detected output. The analog to digital converter includes a number of intermediate analog to digital converters operable to receive the amplified analog input and to yield a plurality of digital streams. Each of the plurality of analog to digital converters samples the amplified analog input with different phase offsets. The analog to digital converter also includes a generalized beamformer operable to form a sample vector from the plurality of digital streams and to perform a vector multiplication operation on the sample vector and on a weight vector to yield the digital data stream. In some cases, the weight vector is generated based at least in part on the digital data stream and the derivative of the detected output.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present invention are related to systems and methods for analog to digital data conversion, and more particularly to analog to digital converters with generalized beamformers. Various embodiments of the present invention utilize the time diversity in an oversampled conversion to reduce the distortion in oversampled analog to digital converter samples. The analog to digital converter with generalized beamformer is adapted in some embodiments to reduce errors after downstream processing, such as mean square errors after downstream equalization in a data read channel.

Figure 1:
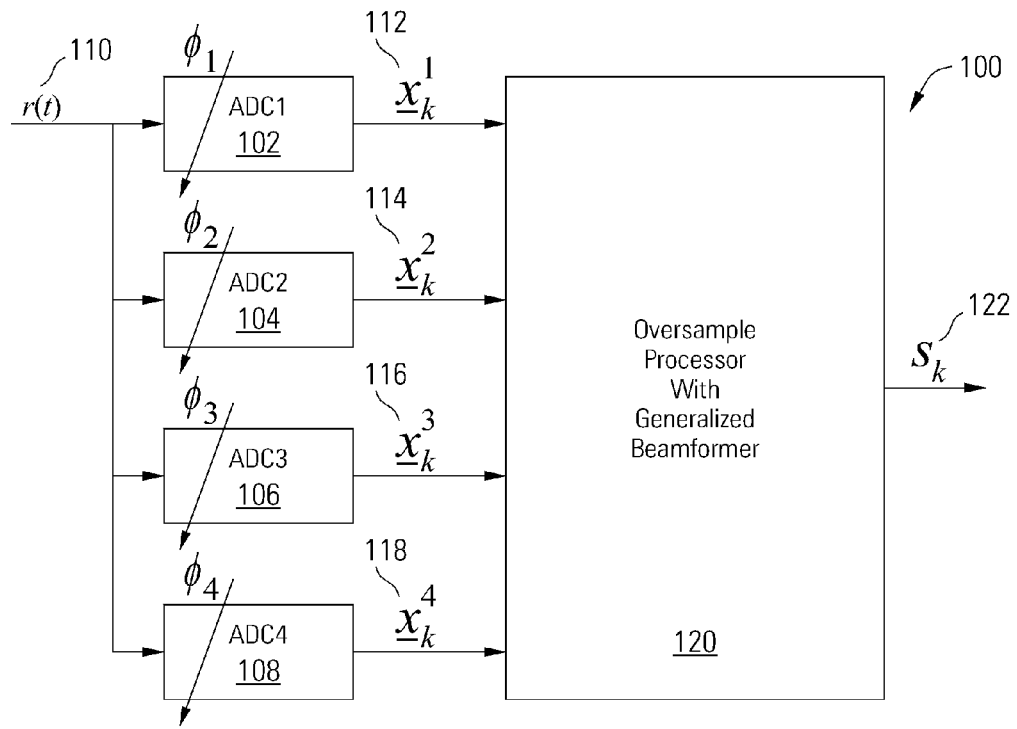
FIG. 1 depicts an analog to digital converter with generalized beamformer in accordance with some embodiments of the present invention.

Turning to FIG. 1, an analog to digital converter 100 is shown that includes multiple internal analog to digital converters 102, 104, 106, 108 to oversample a continuous analog signal 110. Each of the analog to digital converters 102, 104, 106, 108 samples the analog signal 110 at a different phase offset or time, increasing the time diversity in the analog to digital converter 100. The resulting streams of digital samples 112, 114, 116, 118, each representing samples captured from the analog signal 110 at a different phase offset, are provided to an oversample processor with generalized beamformer 120. The streams of digital samples 112, 114, 116, 118 are processed in the oversample processor with generalized beamformer 120 to yield a symbol rate sequence output 122, a stream of beamformed digital values representing the voltage or current level of the analog signal 110. Although four analog to digital converters 102, 104, 106, 108 are shown in the example analog to digital converter 100 of FIG. 1, the analog to digital converter 100 may include any suitable number of analog to digital converters to introduce the desired time diversity.

The oversample processor with generalized beamformer 120 applies weight or gain factors to each of the samples from the analog to digital converters 102, 104, 106, 108 and combines groups of the weighted samples to form output values in the symbol rate sequence output 122. The analog to digital converters 102, 104, 106, 108 effectively provide a phased array input to the oversample processor with generalized beamformer 120. The oversample processor with generalized beamformer 120 weights and combines the streams of digital samples 112, 114, 116, 118 to reduce distortion in the symbol rate sequence output 122 or in downstream signals, or to provide other benefits such as reducing mean square errors in an equalized signal derived from the symbol rate sequence output 122.

The phase offset of each of the analog to digital converters 102, 104, 106, 108 may be established internally in the analog to digital converters 102, 104, 106, 108 or in external delay circuits, or by providing the same analog signal 110 to each of the analog to digital converters 102, 104, 106, 108 and by triggering each of the analog to digital converters 102, 104, 106, 108 by different phases of a clock signal. The phase offset between each of the analog to digital converters 102, 104, 106, 108 may be equal, for example by dividing the period of the analog signal 110 into equal portions, each sampled by a different one of the analog to digital converters 102, 104, 106, 108, where the nature of the analog signal 110 establishes such a period. Where the analog signal 110 is not periodic, the phase offset may be made equal by selecting a time period over which the analog to digital converters 102, 104, 106, 108 will cycle, dividing the time period equally, and delaying each of the analog to digital converters 102, 104, 106, 108 by the resulting fraction of the time period.

In other embodiments, the phases of the analog to digital converters 102, 104, 106, 108 may be non-uniformly separated, which may improve performance in some applications as compared with uniformly separated phases. The non-uniform separation between each of the analog to digital converters 102, 104, 106, 108 may be selected in any suitable manner to improve performance, for example to reduce distortion in the output signal after downstream processing such as reducing mean square errors after equalization of the beamformed digital samples.

Figure 2:
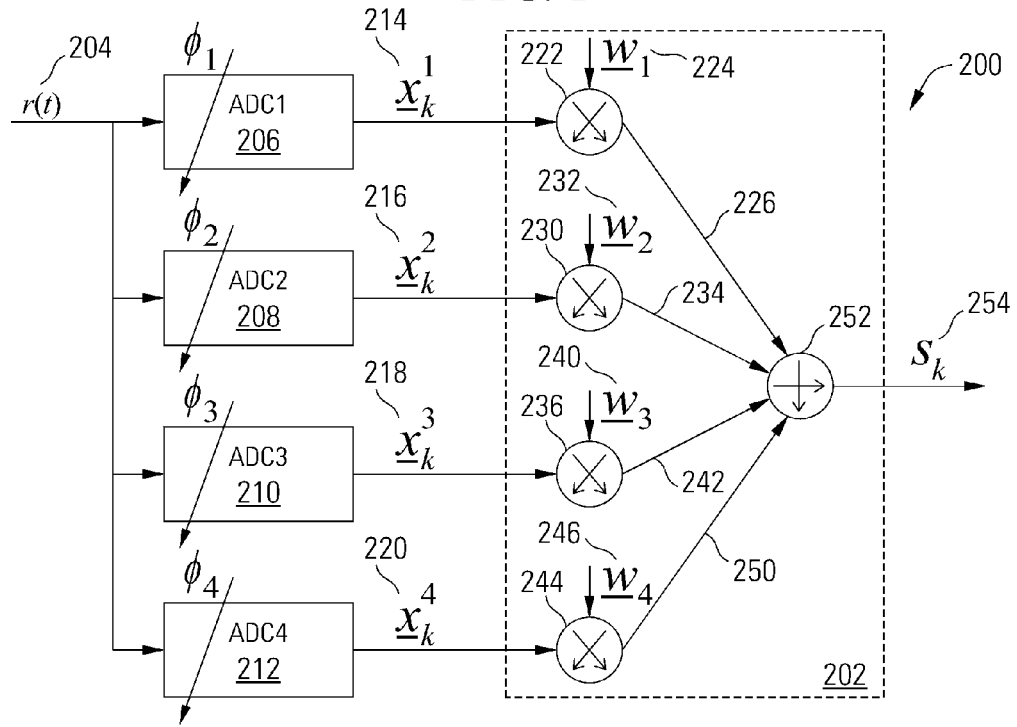
FIG. 2 depicts an oversampled analog to digital converter with details of a generalized beamformer in accordance with some embodiments of the present invention.

Turning to FIG. 2, an analog to digital converter 200 is illustrated, showing details of a generalized beamformer 202. An analog signal 204 is provided to each of a number of phase or time offset analog to digital converters 206, 208, 210, 212, which yield digital sample streams 214, 216, 218, 220. Digital sample stream 214 is provided to multiplier 222, which multiplies samples in the digital sample stream 214 with weight coefficients 224 to yield product 226. Digital sample stream 216 is provided to multiplier 230, which multiplies samples in the digital sample stream 216 with weight coefficients 232 to yield product 234. Digital sample stream 218 is provided to multiplier 236, which multiplies samples in the digital sample stream 218 with weight coefficients 240 to yield product 242. Digital sample stream 220 is provided to multiplier 244, which multiplies samples in the digital sample stream 220 with weight coefficients 246 to yield product 250. Products 226, 234, 242 and 250 are provided to adder 252 where they are added to yield symbol rate sequence output 254.

In some embodiments, the illustration of generalized beamformer 202 is conceptual, with vector forming and vector multiplication operations generally performing the functions illustrated in generalized beamformer 202. In these embodiments, samples from the digital sample streams 214, 216, 218, 220 are used to form a sample vector $\underline{x}$, for example according to Equation 1:

$$\underline{x} = [x_{k-2}^1, x_{k-1}^1, x_k^1, x_{k-2}^2, x_{k-1}^2, x_k^2, x_{k-2}^3, x_{k-1}^3, x_k^3, x_{k-2}^4, x_{k-1}^4, x_k^4] \quad \text{Equation 1}$$

where $x_{k-2}^1, x_{k-1}^1, x_k^1$ represent three consecutive samples from digital sample stream 214, $x_{k-2}^2, x_{k-1}^2, x_k^2$ represent three consecutive samples from digital sample stream 216, $x_{k-2}^3, x_{k-1}^3, x_k^3$ represent three consecutive samples from digital sample stream 218, and $x_{k-2}^4, x_{k-1}^4, x_k^4$ represent three consecutive samples from digital sample stream 220. The form and length of vector $\underline{x}$ is not limited to the example of Equation 1. Vector $\underline{x}$ may be longer or shorter, may have samples from less or more analog to digital converters, can have less or more samples from each analog to digital converter, and can be ordered differently.

Values from weight coefficients 224, 232, 240, 246 are used to form a weight vector $\underline{w}$, for example according to Equation 2:

$$\underline{w} = [w_{1,1}, w_{1,2}, w_{1,3}, w_{2,1}, w_{2,2}, w_{2,3}, w_{3,1}, w_{3,2}, w_{3,3}, w_{4,1}, w_{4,2}, w_{4,3}] \quad \text{Equation 2}$$

where $w_{1,1}, w_{1,2}, w_{1,3}$ represent three weight coefficients associated with samples $x_{k-2}^1, x_{k-1}^1, x_k^1$ from digital sample stream 214, $w_{2,1}, w_{2,2}, w_{2,3}$ represent three weight coefficients associated with samples $x_{k-2}^2, x_{k-1}^2, x_k^2$ from digital sample stream 216, $w_{3,1}, w_{3,2}, w_{3,3}$ represent three weight coefficients associated with samples $x_{k-2}^3, x_{k-1}^3, x_k^3$ from digital sample stream 220, and $w_{4,1}, w_{4,1}, w_{4,3}$ represent three weight coefficients associated with samples $x_{k-2}^4, x_{k-1}^4, x_k^4$ from digital sample stream 220. The form and length of weight vector $\underline{w}$ corresponds to that of sample vector $\underline{x}$.

The sample vector $\underline{x}$ and the weight vector $\underline{w}$ are multiplied in a dot product vector multiplication according to Equation 3 to yield symbol rate sequence output 254:

$$s_k = \underline{w} \underline{x}^T \quad \text{Equation 3}$$

An example of the vector multiplication operation of Equation 3, yielding a scalar output value $s_k$, is set forth in Equation 4:

$$s_k = x_{k-2}^1 w_{1,1} + x_{k-1}^1 w_{1,2} + x_k^1 w_{1,3} + \\ x_{k-2}^2 w_{2,1} + x_{k-1}^2 w_{2,2} + x_k^2 w_{2,3} + x_{k-2}^3 w_{3,1} + \\ x_{k-1}^3 w_{3,2} + x_k^3 w_{3,3} + x_{k-2}^4 w_{4,1} + x_{k-1}^4 w_{4,2} + x_k^4 w_{4,3} \quad \text{Equation 4}$$

In some embodiments, the generalized beamformer 202 yields an output value $s_k$ for symbol rate sequence output 254 for each input sample period k, including two previous sample sets from periods k−2 and k−1 along with the samples from current period k in the vector multiplication to generate the output value $s_k$ for period k. In these embodiments, there is overlap in the samples included in the vector multiplication for each output value $s_k$. In other words, sample vector $\underline{x}$ includes samples from periods k−2, k−1 and k to yield an output value $s_k$ for each sample period k, after which the samples from period k are moved into position k−1 and the samples from period k−1 are moved into position k−2, to be combined with fresh samples for period k to generate the next output value $s_k$. In other embodiments, the generalized beamformer 202 generates just one output value $s_k$ for each set of samples for periods k−2, k−1, and k, then replacing them with three new sample sets.

In some embodiments, the samples in sample vector $\underline{x}$ are not in order of capture, but are grouped by analog to digital converter 206, 208, 210, 212. Given the example sample vector $\underline{x}$ of Equation 1, having four analog to digital converters 206, 208, 210, 212 with three samples each, and with the example ordering of Equation 1, the twelve samples are grouped in a block of contiguous samples, but are not ordered according to sample time along the sample vector $\underline{x}$. Because the output value $s_k$ is a scalar value and the dot product vector product is commutative, the order of the samples in sample vector $\underline{x}$ is arbitrary, as long as sample vector $\underline{x}$ and weight vector $\underline{w}$ are both ordered appropriately to associate $\underline{x}$ and $\underline{w}$ coefficients properly.

In other embodiments, the generalized beamformer 202 is formed with discrete elements (e.g., 222, 230, 236, 244, 252) as illustrated in FIG. 2. In these embodiments, equivalent functions to those described above are performed without vectors, by multiplying individual weight coefficients with digital samples in multipliers 222, 230, 236, 244 and summing the result in adder 252, and further by adding groups of several sums from adder 252.

Equations 1 and 2 are generalized in Equations 3 and 4 below for vectors of length L, given an analog to digital converter 200 with i internal analog to digital converters (e.g., 206, 208, 210, 212). As discussed above, an analog to digital converter may be adapted to other numbers of internal analog to digital converters.

$$\underline{x}_k^i = [x_{k-\Delta_i}^i, x_{k-\Delta_i+1}^i, \ldots, x_{k-\Delta_i+L_i-1}^i] \quad \text{Equation 5}$$

$$\underline{w}_i = [w_{1,i}, w_{2,i}, \ldots, w_{L_i,i}], 1 \leq i \leq 4 \quad \text{Equation 6}$$

To summarize, $\underline{w}$ is a weight vector which works on the oversampled analog to digital converter sample vector $\underline{x}$ and $s_k$ is a weighted sum of $\underline{x}$ at symbol rate.

Figure 3:
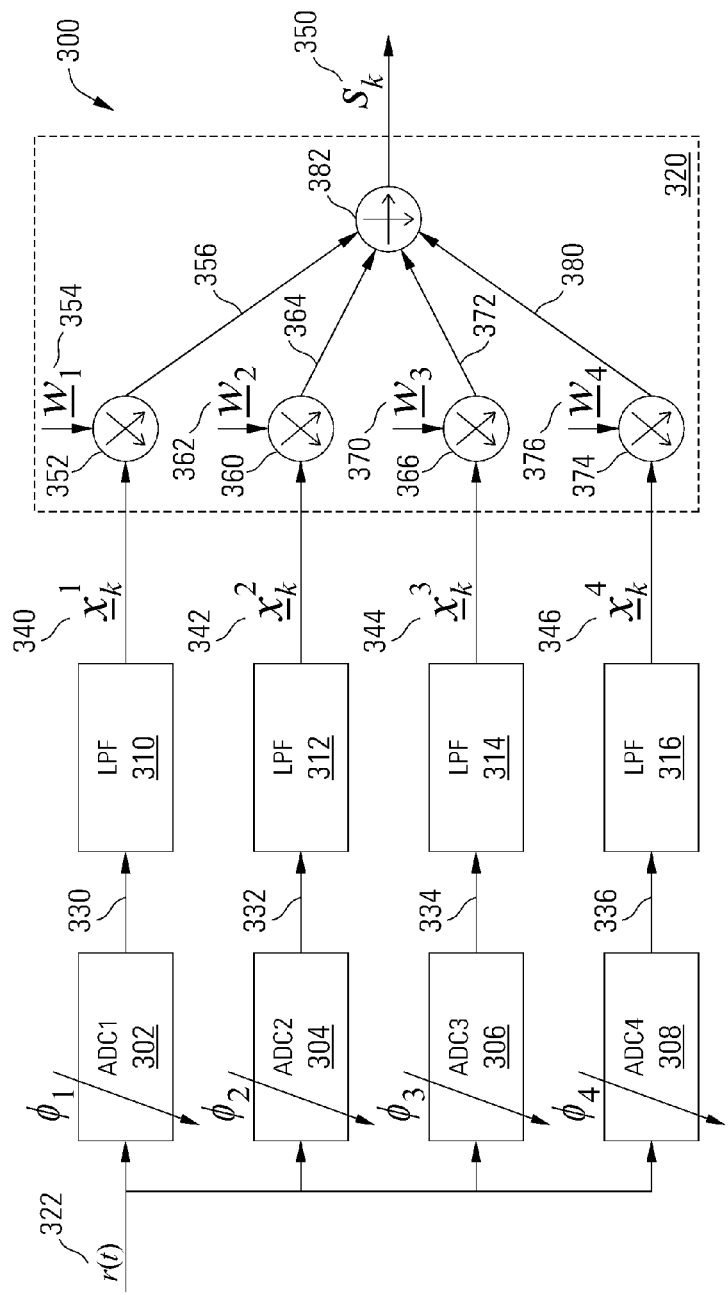
FIG. 3 depicts an oversampled analog to digital converter with low pass filters and generalized beamformer in accordance with some embodiments of the present invention.

Turning to FIG. 3, in another embodiment of an analog to digital converter 300, the output of analog to digital converters 302, 304, 306, 308 is filtered in one or more low pass filters 310, 312, 314, 316 before entering the generalized beamformer 320. An analog signal 322 is provided to each of the analog to digital converters 302, 304, 306, 308 to be sampled with different phase or time offsets. The analog to digital converters 302, 304, 306, 308 may be any circuit known in the art that is capable of providing a digital representation of an analog signal. Based upon the disclosure provided herein, one of ordinary skill in the art will recognize a variety of circuits that may be used to implement analog to digital converters 302, 304, 306, 308. The streams of digital samples 330, 332, 334, 336 are provided to low pass filters 310, 312, 314, 316 to yield filtered digital sample streams 340, 342, 344, 346. In some embodiments, the streams of digital samples 330, 332, 334, 336 are filtered separately in independent low pass filters 310, 312, 314, 316 as in FIG. 3. In some embodiments, the streams of digital samples 330, 332, 334, 336 are filtered in a single low pass filter, for example by interleaving and combining the streams of digital samples 330, 332, 334, 336 to put them back in the sampling order in a single stream before filtering. The low pass filters 310, 312, 314, 316 may be adapted with any of a variety of filter characteristics to meet the objectives of the analog to digital converter 300, such as reducing distortion in the output 350 or reducing mean square errors in a downstream equalized signal derived from output 350.

Filtered digital sample stream 340 is provided to multiplier 352, which multiplies samples in the filtered digital sample stream 340 with weight coefficients 354 to yield product 356. Filtered digital sample stream 342 is provided to multiplier 360, which multiplies samples in the filtered digital sample stream 342 with weight coefficients 362 to yield product 364. Filtered digital sample stream 344 is provided to multiplier 366, which multiplies samples in the filtered digital sample stream 344 with weight coefficients 370 to yield product 372. Filtered digital sample stream 346 is provided to multiplier 374, which multiplies samples in the filtered digital sample stream 346 with weight coefficients 376 to yield product 380. Products 356, 364, 372, 380 are provided to adder 382 where they are added to yield symbol rate sequence output 350. Again, as discussed above, the generalized beamformer 320 may include discrete components (e.g., 352, 360, 366, 374) to perform the described functions, or in other embodiments, the described functions of the generalized beamformer 320 may be performed with any suitable hardware, firmware, or software in any combinations. For example, the generalized beamformer 320 may be implemented in an integrated circuit designed to perform the vector operations set forth in the equations herein or variations thereof.

Figure 4:
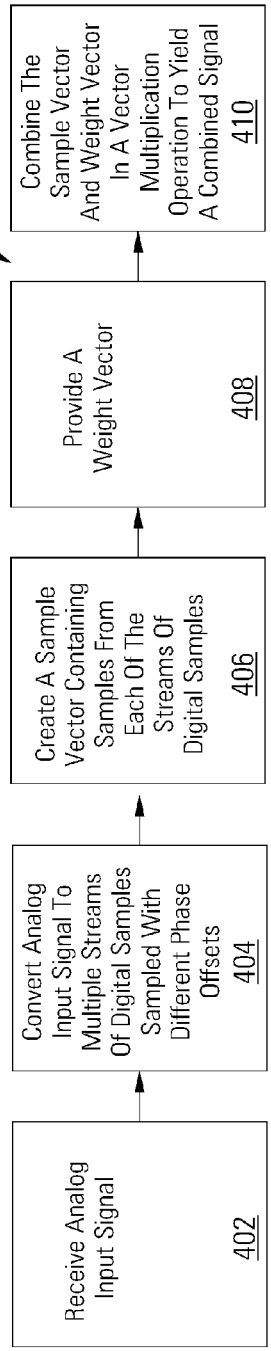
FIG. 4 is a flow diagram showing a method for converting an analog signal to a stream of digital samples in accordance with some embodiments of the present invention.

Turning to FIG. 4, a flow diagram 400 shows a method for converting an analog signal to a stream of digital samples in accordance with some embodiments of the present invention. Following flow diagram 400, an analog input signal is received. (Block 402) The analog input signal is converted to multiple streams of digital samples sampled with different phase offsets. (Block 404) The streams of digital samples are produced in some embodiments in a number of analog to digital converters, one per stream of digital samples. In other embodiments, multiple analog to digital converters may be used to produce each stream of digital samples. In yet other embodiments, fewer analog to digital converters may be shared to produce the streams of digital samples. The digital samples may be formed from the analog input signal in any of a variety of suitable manners. The method also includes creating a sample vector containing samples from each of the streams of digital samples. (Block 406) The sample vector may take the form of Equations 1 or 5, or may be adapted as desired based on the number of streams of digital samples included, the desired vector length, the ordering of samples within the sample vector, etc. A weight vector is provided (block 408), for example as in Equation 6, with coefficients in the weight vector corresponding to samples in the sample vector. The weight vector is designed to reduce distortion in the output 350 or to reduce mean square errors in a downstream equalized signal derived from output 350, or to meet other goals. An example design criterion will be discussed below. The sample vector and weight vector are combined in a vector multiplication operation to yield a combined signal. (Block 410) The vector multiplication operation is performed in some embodiments as set forth in Equations 3 and 4. The resulting combined signal is a stream of digital values representing the analog input signal. Notably, the method is not limited to implementation in the order presented in FIG. 4. For example, the weight vector may be designed when the analog to digital converter or the overall system containing the analog to digital converter is designed.

Figure 5:
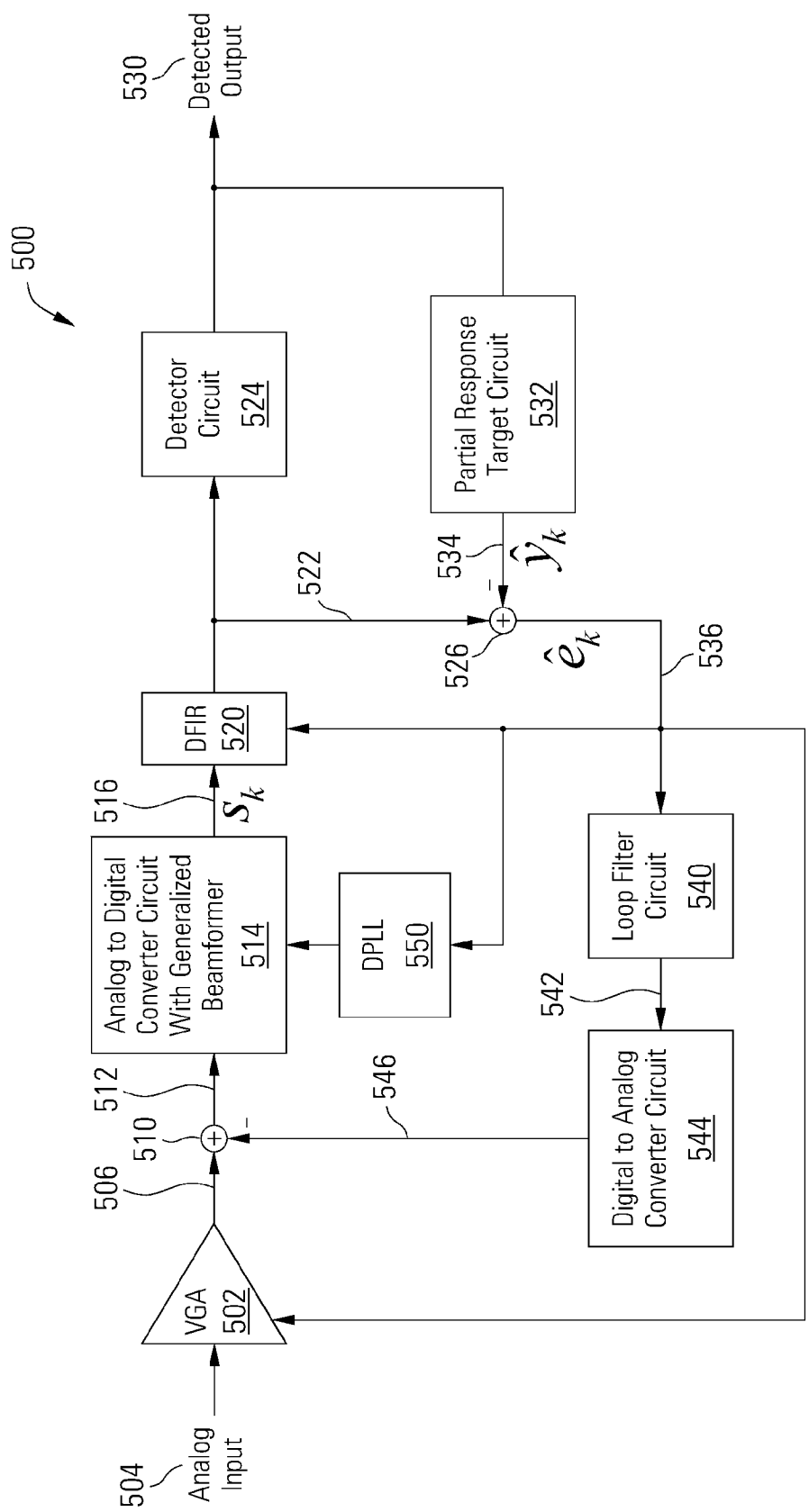
FIG. 5 depicts a DC loop read channel circuit for a storage system or wireless communication system that includes an analog to digital converter with generalized beamformer in accordance with some embodiments of the present invention.

Turning to FIG. 5, a DC loop read channel circuit 500 is illustrated as an example application of an analog to digital converter with generalized beamformer in accordance with some embodiments of the present invention. However, it is important to note that the analog to digital converter with generalized beamformer disclosed herein is not limited to any particular application such as the DC loop read channel circuit 500 of FIG. 5.

The DC loop read channel circuit 500 may be used, for example, to process data from a storage system or wireless communication system. DC loop read channel circuit 500 includes a variable gain amplifier (VGA) 502 that receives an analog input 504. Variable gain amplifier 502 amplifies analog input 504 to yield an amplified output 506 that is provided to a summation circuit 510. Summation circuit 510 subtracts a feedback signal 546 from amplified output 506 to yield a sum 512.

Sum 512 is provided to an analog to digital converter with generalized beamformer 514 that converts the received signal into a series of digital samples 516 that are provided to a digital finite impulse response (DFIR) filter 520. Digital finite impulse response filter 520 acts as an equalizer and filters the received input to provide a corresponding filtered output 522 to both a detector circuit 524 and a summation circuit 526. Detector circuit 524 performs a data detection process on the received input resulting in a detected output 530. In performing the detection process, detector circuit 524 attempts to correct any errors in the received data input.

Detected output 530 is provided to a partial response (PR) target circuit 532 that creates a partial response output 534 compatible with filtered output 522. In some embodiments, the partial response target circuit 532 is operable to convolve the detected output 530 with a target to yield partial response output 534 as the derivative of the detected output 530. Summation circuit 526 subtracts partial response output 534 from filtered output 522 to yield an error value 536. Error value 536 is provided to a loop filter circuit 540 that filters the received input and provides a filtered output 542 to a digital to analog converter (DAC) circuit 544. Digital to analog converter circuit 544 converts the received input to feedback signal 546.

The digital finite impulse response filter 520 acts as an equalizer on the digital samples 516 from the analog to digital converter 514, compensating for inter-symbol interference (ISI) resulting from data being transmitted at high speed through band-limited channels. However, although the equalization performed in the digital finite impulse response filter 520 reduces inter-symbol interference, it can introduce mean square errors between the digital samples $s_k$ 516 and partial response output $\hat{y}_k$ 534 in filtered output 522.

The weight vector $\underline{w}$ can be targeted to reduce the mean squared error between the digital samples $s_k$ 516 and partial response output $\hat{y}_k$ 534, or the mean squared error in error value $\hat{e}_k$ 536. To obtain the partial response output $\hat{y}_k$ 534, data may be passed through the DC loop read channel circuit 500 or a simulation of the DC loop read channel circuit 500 in which the analog to digital converter circuit with generalized beamformer 514 will be used. The optimal weight vector $\underline{w}_{opt}$ targeted to reduce the mean squared error can be found using Equation 7 as follows:

$$\underline{w}_{opt} = \min_{\underline{w}} E\{|s_k - \hat{y}_k|^2\} \qquad \text{Equation 7}$$

where E{ } is an expectation function for random variables. The minimum mean square error (MMSE) solution is given by Equation 8:

$$\underline{w}_{opt} = R_x^{-1} \cdot r_{xy} \qquad \text{Equation 8}$$

where $R_x = E[\underline{x}^T \cdot \underline{x}]$, $\underline{x}^T$ being the transpose of $\underline{x}$, and $r_{xy} = E[\underline{x}^T \cdot \hat{y}_k]$, if we assume zero mean analog to digital converter samples. Thus, in some embodiments, optimal weight vector $w_{opt}$ may be found by calculating the inverse auto correlation of the sample vector $\underline{x}$ vector multiplied with its transpose $\underline{x}^T$ to yield $R_x^{-1}$, and the autocorrelation of transposed sample vector $\underline{x}^T$ vector multiplied with downstream partial response output $\overline{\hat{y}}_k$ to yield $r_{xy}$, and vector multiplying $R_x^{-1}$ with $r_{xy}$ to yield optimal weight vector $w_{opt}$.

In other embodiments, the optimal weight vector $w_{opt}$ may be adapted using other algorithms, such as least mean square (LMS) or other algorithms. The error value $\hat{e}_k$ 536 can be used as feedback to adapt the behavior of the digital finite impulse response filter 520 and the gain of the variable gain amplifier 502, and to a digital phase lock loop (DPLL) 550 which provides a clock signal with multiple phases to the analog to digital converter with generalized beamformer to control the rate and phase of conversion.

Figure 6:
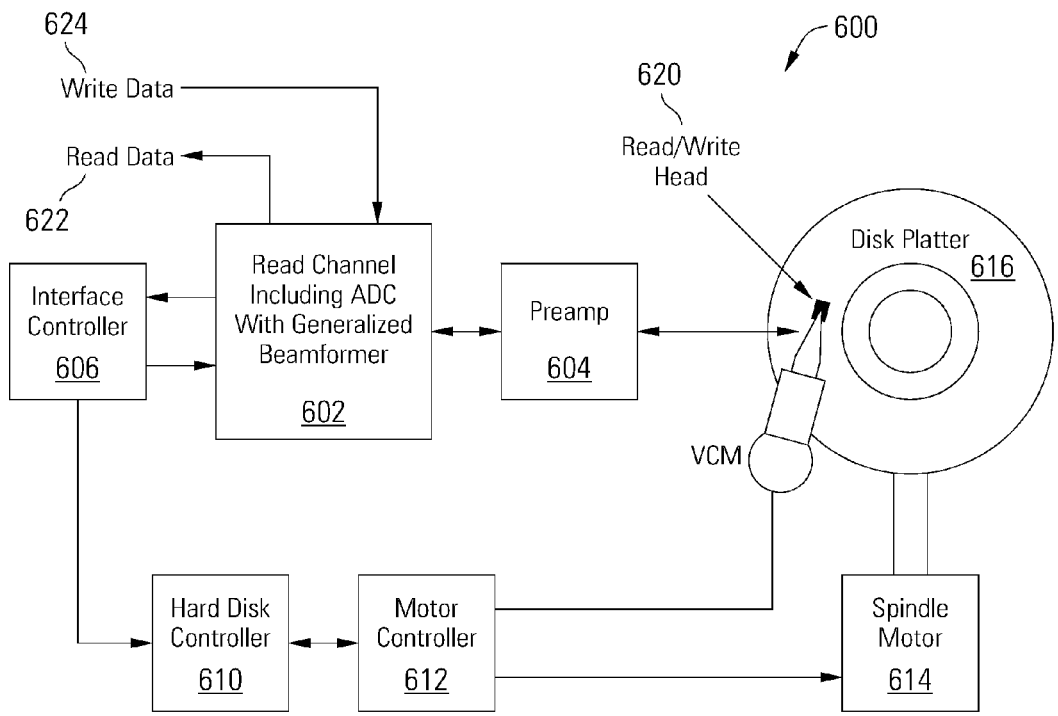
FIG. 6 depicts a storage system including a read channel circuit with an analog to digital converter with generalized beamformer in accordance with some embodiments of the present invention.
Figure 7:
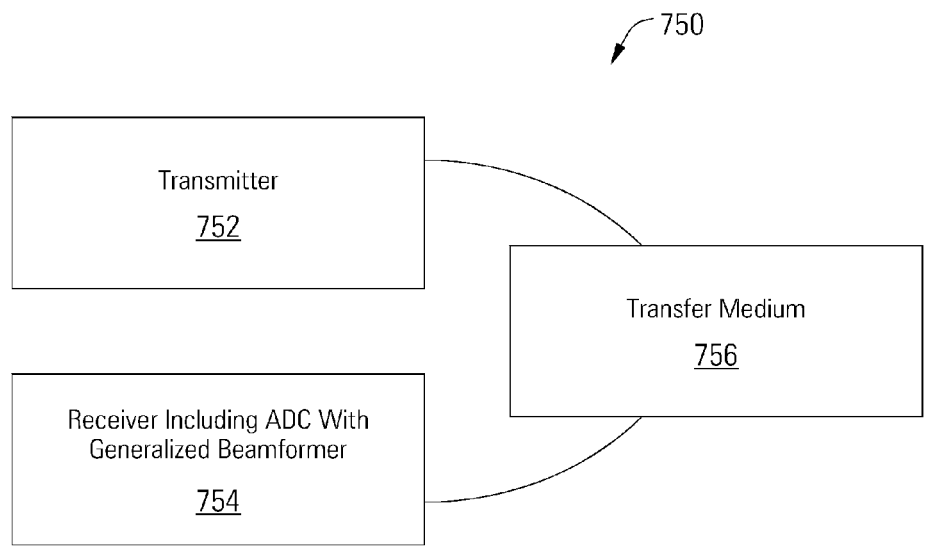
FIG. 7 depicts a wireless communication system including a receiver with an analog to digital converter with generalized beamformer in accordance with some embodiments of the present invention.

Example applications of a DC loop read channel circuit with an analog to digital converter with generalized beamformer include a storage system and a wireless communication system, illustrated in FIGS. 6 and 7. FIG. 6 shows a storage system 600 including a read channel circuit 602 with an analog to digital converter with generalized beamformer in accordance with some embodiments of the present invention. Storage system 600 may be, for example, a hard disk drive. Storage system 600 also includes a preamplifier 604, an interface controller 606, a hard disk controller 610, a motor controller 612, a spindle motor 614, a disk platter 616, and a read/write head assembly 620. Interface controller 606 controls addressing and timing of data to/from disk platter 616. The data on disk platter 616 consists of groups of magnetic signals that may be detected by read/write head assembly 620 when the assembly is properly positioned over disk platter 616. In one embodiment, disk platter 616 includes magnetic signals recorded in accordance with either a longitudinal or a perpendicular recording scheme.

In a typical read operation, read/write head assembly 620 is accurately positioned by motor controller 612 over a desired data track on disk platter 616. Motor controller 612 both positions read/write head assembly 620 in relation to disk platter 616 and drives spindle motor 614 by moving read/write head assembly 620 to the proper data track on disk platter 616 under the direction of hard disk controller 610. Spindle motor 614 spins disk platter 616 at a determined spin rate (RPMs). Once read/write head assembly 620 is positioned adjacent the proper data track, magnetic signals representing data on disk platter 616 are sensed by read/write head assembly 620 as disk platter 616 is rotated by spindle motor 614. The sensed magnetic signals are provided as a continuous, minute analog signal representative of the magnetic data on disk platter 616. This minute analog signal is transferred from read/write head assembly 620 to read channel circuit 602 via preamplifier 604. Preamplifier 604 is operable to amplify the minute analog signals accessed from disk platter 616. In turn, read channel circuit 602 decodes and digitizes the received analog signal to recreate the information originally written to disk platter 616. This data is provided as read data 622 to a receiving circuit. As part of decoding the received information, read channel circuit 602 processes the received signal using an analog to digital converter with generalized beamformer. Such an analog to digital converter with generalized beamformer may be implemented consistent with that described above in relation to FIGS. 1-3. In some cases, the analog to digital conversion may be performed consistent with the flow diagram discussed above in relation to FIG. 4. A write operation is substantially the opposite of the preceding read operation with write data 624 being provided to read channel circuit 602. This data is then encoded and written to disk platter 616.

It should be noted that storage system 600 may be integrated into a larger storage system such as, for example, a RAID (redundant array of inexpensive disks or redundant array of independent disks) based storage system. It should also be noted that various functions or blocks of storage system 600 may be implemented in either software or firmware, while other functions or blocks are implemented in hardware.

Turning to FIG. 6, a wireless communication system 650 including a receiver with a DC loop circuit using an analog to digital converter with generalized beamformer is shown in accordance with some embodiments of the present invention. Communication system 650 includes a transmitter 652 that is operable to transmit encoded information via a transfer medium 656 as is known in the art. The encoded data is received from transfer medium 656 by receiver 654. Receiver 654 incorporates a DC loop circuit using an analog to digital converter with generalized beamformer. Such an analog to digital converter with generalized beamformer may be implemented consistent with that described above in relation to FIGS. 1-3. In some cases, the analog to digital conversion may be done consistent with the flow diagram discussed above in relation to FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for performing analog to digital conversion. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An analog to digital converter circuit, the analog to digital converter circuit comprising:
    an analog input;
    a plurality of analog to digital converters operable to receive the analog input and to yield a plurality of digital streams, each of the plurality of analog to digital converters sampling the analog input with different phase offsets; and
    a generalized beamformer operable to weight and combine the plurality of digital streams to yield a digital output.

2. The analog to digital converter circuit of claim 1, wherein the generalized beamformer is operable to form a sample vector from the plurality of digital streams and to perform a vector multiplication operation on the sample vector and on a weight vector to yield the digital output.

3. The analog to digital converter circuit of claim 2, wherein the weight vector is operable to reduce a mean square error between the digital output and a signal derived from the digital output.

4. The analog to digital converter circuit of claim 3, wherein the weight vector is generated using a minimum mean square error algorithm based on the digital output and the signal derived from the digital output.

5. The analog to digital converter circuit of claim 1, wherein the analog to digital converter circuit is implemented as an integrated circuit.

6. The analog to digital converter circuit of claim 1, wherein the analog to digital converter circuit is incorporated in a storage device.

7. The analog to digital converter circuit of claim 1, wherein the analog to digital converter circuit is incorporated in a data transmission device.

8. The analog to digital converter circuit of claim 1, wherein the plurality of analog to digital converters are clocked with different phases of a clock signal.

9. The analog to digital converter circuit of claim 1, wherein the plurality of analog to digital converters generate the plurality of digital streams with non-uniform separation between the different phase offsets.

10. The analog to digital converter circuit of claim 1, further comprising a lowpass filter operable to filter the plurality of digital streams before the generalized beamformer weights and combines them to yield the digital output.

11. The analog to digital converter circuit of claim 1, wherein the generalized beamformer comprises at least one vector multiplication circuit and a vector summation circuit operable to weight and combine the plurality of digital streams to yield the digital output.

12. The analog to digital converter circuit of claim 11, wherein the at least one vector multiplication circuit comprises one vector multiplication circuit for each of the plurality of digital streams.

13. A method for converting an analog signal to a digital signal, the method comprising:
    converting the analog signal to multiple streams of digital samples sampled with different phase offsets;
    creating a sample vector containing samples from each of the streams of digital samples;
    providing a weight vector adapted to reduce distortion in the digital signal; and
    combining the sample vector and the weight vector in a vector multiplication operation to yield the digital signal.

14. The method of claim 13, wherein the weight vector is generated based on the digital signal and a signal derived from the digital signal.

15. The method of claim 14, wherein the signal derived from the digital stream is generated by passing the digital signal through a digital finite impulse response filter, a detector circuit and a partial response target circuit.

16. The method of claim 14, wherein the weight vector $w_{opt}$ is generated according to an equation $w_{opt}=R_x^{-1} \cdot r_{xy}$, where $R_x=E[x^T \cdot x]$, $r_{xy}=E[x \cdot \hat{y}_k]$, x is the sample vector, and $\hat{y}_k$ is the signal derived from the digital signal.

17. The method of claim 14, wherein the weight vector is targeted to reduce a mean square error between the digital signal and the signal derived from the digital signal.

18. The method of claim 13, wherein the sample vector contains a plurality of contiguous samples from each of the streams of digital samples.

19. A storage system, the storage system comprising:
    a storage medium;
    a read/write head assembly operable to sense a data set on the storage medium and to provide an analog signal corresponding to the data set;
    an amplifier circuit operable to amplify the analog signal to yield an amplified analog signal;
    an analog to digital converter operable to sample the amplified analog signal to yield a digital data stream;
    a digital finite impulse response filter operable to filter the digital data stream to yield a filtered digital data stream;
    a data detector circuit operable to perform a data detection process on the filtered digital data stream to yield a detected output;
    a partial response target circuit operable to convolve the detected output with a target to yield a derivative of the detected output; and
    wherein the analog to digital converter comprises:
       a plurality of intermediate analog to digital converters operable to receive the amplified analog input and to yield a plurality of digital streams, each of the plurality of analog to digital converters sampling the amplified analog input with different phase offsets; and
       a generalized beamformer operable to form a sample vector from the plurality of digital streams and to perform a vector multiplication operation on the sample vector and on a weight vector to yield the digital data stream.

20. The storage system of claim 19, wherein the weight vector is generated based at least in part on the digital data stream and the derivative of the detected output.

* * * * *